US012803563B2

(12) United States Patent
Pike et al.

(10) Patent No.: US 12,803,563 B2
(45) **Date of Patent: *Nov. 17, 2026**

(54) METHOD AND APPARATUS FOR CLOCK AND DATA ALIGNMENT THAT REDUCES POWER CONSUMPTION

(71) Applicant: CIENA CORPORATION, Hanover, MD (US)

(72) Inventors: Jacob Pike, Ottawa (CA); Sadok Aouini, Gatineau (CA); Naim Ben-Hamida, Ottawa (CA)

(73) Assignee: CIENA CORPORATION, Fulton, MD (US)

( * ) Notice: Subject to any disclaimer, the term of this patent is extended or adjusted under 35 U.S.C. 154(b) by 18 days.

This patent is subject to a terminal disclaimer.

(21) Appl. No.: 18/944,162

(22) Filed: Nov. 12, 2024

(65) Prior Publication Data

US 2025/0070789 A1 Feb. 27, 2025

Related U.S. Application Data

(63) Continuation of application No. 18/060,787, filed on Dec. 1, 2022, now Pat. No. 12,176,908.

(51) Int. Cl.

*H03L 7/099* (2006.01)
*H03L 7/081* (2006.01)
*H04L 7/00* (2006.01)

(52) U.S. Cl.

CPC .......... *H03L 7/0998* (2013.01); *H03L 7/0814* (2013.01); *H04L 7/0025* (2013.01)

(58) Field of Classification Search

CPC ..... H03L 7/0998; H03L 7/0814; H03L 7/091; H04L 7/0025

See application file for complete search history.

(56) References Cited

U.S. PATENT DOCUMENTS

| | | | | |
|---|---|---|---|---|
| 7,864,080 | B1 | 1/2011 | Demirsoy et al. | |
| 9,876,489 | B1 | 1/2018 | Casey et al. | |
| 9,900,017 | B1 * | 2/2018 | Clark | H03M 1/0626 |
| 10,992,501 | B1 * | 4/2021 | Sun | H03L 7/07 |
| 11,233,519 | B1 | 1/2022 | Lam et al. | |

(Continued)

OTHER PUBLICATIONS

Abishek Namachivayam, High speed Clock and Data Recovery Analysis, Thesis, The Ohio State University, 2020 (Year: 2020).*

(Continued)

*Primary Examiner* — Aristocratis Fotakis

(74) *Attorney, Agent, or Firm* — Guntin & Gust, PLC; Erik Boyd

(57) ABSTRACT

Aspects of the subject disclosure may include, for example, implementing a first stage including a first number of phase rotators in parallel generating respective clock phases offset by a fixed amount; a second stage including a second number of phase rotators receiving outputs from the first number of phase rotators of the first stage, the second stage outputting a first weighted sum of respective clock phases generated by the second number of phase rotators. The subject disclosure further includes the second number of phase rotators being less than the first number of phase rotators, and a total number of bits dedicated to phase selection being split across the first stage and the second stage. Other embodiments are disclosed.

20 Claims, 21 Drawing Sheets

(56) References Cited

U.S. PATENT DOCUMENTS

| | | | | |
|---|---|---|---|---|
| 11,451,250 | B1 * | 9/2022 | Dedic | H03M 1/0624 |
| 11,658,648 | B1 * | 5/2023 | Jeon | H03L 7/081 327/156 |
| 2002/0009170 | A1 * | 1/2002 | Schmatz | H03L 7/07 375/376 |
| 2008/0063124 | A1 | 3/2008 | Song et al. | |
| 2012/0033773 | A1 | 2/2012 | Nedovic | |
| 2012/0313683 | A1 | 12/2012 | Rylov | |
| 2013/0163701 | A1 | 6/2013 | Buchwald et al. | |
| 2013/0207707 | A1 * | 8/2013 | Agrawal | H03K 5/135 327/237 |
| 2014/0103986 | A1 | 4/2014 | De Caro et al. | |
| 2014/0254644 | A1 * | 9/2014 | Gotman | H04L 27/01 375/222 |
| 2014/0269783 | A1 | 9/2014 | Bae et al. | |
| 2017/0331619 | A1 | 11/2017 | Azenkot et al. | |
| 2018/0106889 | A1 * | 4/2018 | Schuck | G01S 13/886 |
| 2019/0028093 | A1 | 1/2019 | Tsuji | |
| 2019/0058576 | A1 | 2/2019 | Lim | |
| 2019/0288830 | A1 | 9/2019 | Zhuang et al. | |
| 2019/0289241 | A1 | 9/2019 | Saeki et al. | |
| 2019/0334693 | A1 | 10/2019 | Liu et al. | |
| 2022/0070031 | A1 * | 3/2022 | Ganesan | H04L 25/03057 |
| 2023/0006680 | A1 | 1/2023 | Lam et al. | |
| 2023/0138296 | A1 | 5/2023 | Lee et al. | |
| 2023/0246649 | A1 | 8/2023 | Wang et al. | |
| 2024/0187008 | A1 | 6/2024 | Pike et al. | |
| 2025/0158623 | A1 | 5/2025 | Pike et al. | |
| 2026/0074682 | A1 | 3/2026 | Weiss et al. | |

OTHER PUBLICATIONS

"International Search Report & Written Opinion for Application No. PCT/US2024/054897", Feb. 18, 2025, 15 pages.

"International Search Report and Written Opinion received for PCT Application Serial No. PCT/US2024/055675", 13 Pages.

Abdo, et al., "Low-Power Circuit for Measuring and Compensating Phase Interpolator Non-Linearity", 2019 IEEE 10th Annual Information Technology, Electronics and Mobile Communication Conference (IEMCON), IEEE, DOI: 10.1109/IEMCON.2019.8936145, Oct. 17, 2019, 4 pages.

Lin, et al., "A High Speed, Low Power and Low Phase Noise Divider for Wideband Application", 2023 IEEE 15th International Conference on ASIC (ASICON), IEEE, DOI: 10.1109/ASICON58565.2023.10396383 section II entitled: "Proposed Clock Chain".

Won, et al., "A 0.87 W Transceiver IC for 100 Gigabit Ethernet in 40 nm CMOS", IEEE Journal of Solid-State Circuits, IEEE, USA, vol. 50, No. 2, DOI: 10.1109/JSSC.2014.2369494, Feb. 1, 2015, 15 pages.

"International Preliminary Report on Patentability for Appln. No. PCT/US2023/081519", Jun. 12, 2025, 9 pages.

"International Search Report and Written Opinion for Application No. PCT/US2023/081519", Jun. 5, 2024, 14 pages.

"Kaiser window", Matlab kaiser, Printed Nov. 2022, 3 pages.

"Kaiser window", FIR filter design estimation parameters—Matlab kaiserord, Printed Nov. 2022, 7 pages.

Chen, Wei-Chih , et al., "A 4-to-18GHz Active Poly Phase Filter Quadrature Clock Generator with Phase Error Correction in 5nm CMOS", Downloaded Jun. 13, 2022, 2 pages.

Chen, Stanley , et al., "Clock Generation for High-Speed Links", IEEE International Solid-State Circuits Conference (ISSCC); Session 25, 25.1, 2018, 3 pages.

Dalt, Nicola Da, et al., "On the Jitter Requirements of the Sampling Clock for Analog-to-Digital Converters", IEEE Transactions on Circuits and Systems—I: Fundamental Theory and Applications, vol. 49, No. 9, Sep. 2002, 7 pages.

Gangasani, G. , et al., "Ultra-High-Speed Wireline", IEEE International Solid-State Circuits Conference (ISSCC); ISSCC 2022; Session 6, 6.5, 2022, 3 pages.

Goyal, Arun , et al., "A High-Resolution Digital Phase Interpolator based CDR with a Half-Rate Hybrid Phase Detector", Conference Paper, May 2019, 6 pages.

Guo, Z. , et al., "6.2 A 112.5Gb/S ADC-DSP-Based PAM-4 Long-Reach Transceiver with >50dB Channel Loss in 5nm FinFET", ISSCC 2022 / Session 6 / Ultra-High-Speed Wireline / 6.2, 2022 IEEE International Solid-State Circuits Conference, 3 pp.

Guo, Z. , et al., "Ultra-High-Speed Wireline", IEEE International Solid-State Circuits Conference (ISSCC); Session 6, 6.2, 2022, 3 pages.

Hafez, Amr Amin, et al., "Analysis and Design of Superharmonic Injection-Locked Multipath Ring Oscillators", IEEE Transactions on Circuits and Systems—I: Regular Papers, vol. 60, No. 7, Jul. 2013, 1712-1725.

Im, Jay , et al., "Ultra-High-Speed Wireline", IEEE International Solid-State Circuits Conference (ISSCC), Session 6, 6.1, 2020, 3 pages.

Jee, Dong-Woo , et al., "A FIR-Embedded Phase Interpolator Based Noise Filtering for Wide-Bandwidth Fractional-N PLL", IEEE Journal of Solid-State Circuits, vol. 48, No. 11, Nov. 2013, 10 pages.

Kong, Long , et al., "A 2.4-GHz RF Fractional-N Synthesizer With BW=0.25 fREF", IEEE Journal of Solid-State Circuits, vol. 53, No. 6, Jun. 2018, 12 pages.

Monaco, Enrico , et al., "A 2-11 GHz 7-Bit High-Linearity Phase Rotator Based on Wideband Injection-Locking Multi-Phase Generation for High-Speed Serial Links in 28-nm CMOS FDSOI", IEEE Journal of Solid-State Circuits, Jul. 2017, 14 pages.

Narayanan, Aravind Tharayil, et al., "A Fractional-N Sub-Sampling PLL using a Pipelined Phase-Interpolator With an FoM of -250 dB", IEEE Journal of Solid-State Circuits, vol. 51, No. 7, Jul. 2016, 11 pages.

Rice, S. O., "Mathematical Analysis of Random Noise", Bell System Technical Journal, Downloaded on Jun. 18, 2023, 52 pages.

Rogers, Jonathan E., "200Gb/s Serial Transceiver Design: Challenges and Opportunities", IEEE International Solid-State Circuits Conference; Forum 4.2, 2022, 41 pages.

Segal, Yoav, et al., "Ultra-High-Speed Wireline", IEEE International Solid-State Circuits Conference (ISSCC); Session 6, 6.1, 2022, 3 pages.

Tyagi, Kshitiz , et al., "Performance Bounds of ADC-Based Receivers Due to Clock Jitter", IEEE Transactions on Circuits and Systems-II: Express Briefs, vol. 70, No. 5, May 2023, 5 pages.

Wang, Zhaowen , et al., "Advanced Wireline Links and Techniques", IEEE International Solid-State Circuits Conference (ISSCC); Session 17, 17.6, 2022, 3 pages.

Ye, Bingyi , et al., "Ultra-High-Speed Wireline", IEEE International Solid-State Circuits Conference (ISSCC); Session 6, 6.3, 2022, 3 pages.

Yu, Zhengtao , et al., "A 610-M Hz FIR Filter Using Rotary Clock Technique", IEEE 2007 Custom Intergrated Circuits Conference (CICC), 2007, 4 pages.

Zand, Bahram , et al., "Ultra-High-Speed Wireline", IEEE International Solid-State Circuits Conference (ISSCC), 2022, 3 pages.

Zhao, Yu , et al., "Advanced Wireline Links and Techniques", IEEE International Solid-State Circuits Conference (ISSCC); Session 17, 17.4, 2022, 3 pages.

"International Preliminary Report on Patentability for Appln. No. PCT/US2024/054897", May 28, 2026, 11 pages.

* cited by examiner

200

METHOD AND APPARATUS FOR CLOCK AND DATA ALIGNMENT THAT REDUCES POWER CONSUMPTION

CROSS-REFERENCE TO RELATED APPLICATION(S)

This application is a continuation of U.S. patent application Ser. No. 18/060,787 by Pike et al., filed Dec. 1, 2022, entitled "Method and Apparatus for Clock and Data Alignment That Reduces Power Consumption," all sections of which are incorporated by reference herein in their entirety.

FIELD OF THE DISCLOSURE

The subject disclosure relates to a method and apparatus for clock and data alignment that reduces power consumption.

BACKGROUND

The demand for greater bandwidth from data centers continues to increase, necessitating the need for faster optical and electrical communication hardware. Despite the demand for faster communication, there is a limitation on the power that the hardware can consume fueled by capacity and environmental concerns. Existing data centers are equipped to handle a limited amount of power from the grid and current estimates suggest that data centers will consume 8% of the world's total power by 2030.

BRIEF DESCRIPTION OF THE DRAWINGS

Reference will now be made to the accompanying drawings, which are not necessarily drawn to scale, and wherein.

DETAILED DESCRIPTION

Figure 1:
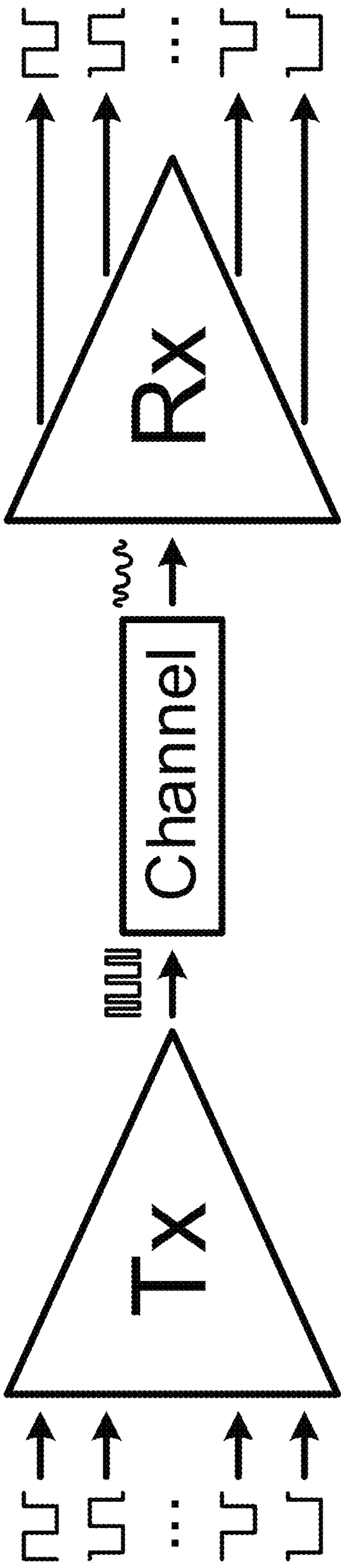
FIG. 1 shows an example, non-limiting embodiment of a Serializer/Deserializer (SerDes) in accordance with various aspects described herein.

The subject disclosure describes, among other things, illustrative embodiments for a method of pipelining phase rotators that results in power and area savings. Other embodiments are described in the subject disclosure.

One or more aspects of the subject disclosure include combination of pipelining and twin Phase Rotators (PRs) to create a low power, jitter and area Clock-and-Data Recovery (CDR) loop.

One or more aspects of the subject disclosure include the use of a Finite Impulse Response (FIR) filter in a CDR loop that helps suppress phase noise and reduce jitter.

Techniques herein include a method of pipelining PRs that results in power and area savings. A combination of pipelining and twin PRs creates a low power, jitter and area CDR loop. The use of an FIR filter in a CDR loop helps to suppress phase noise and reduce jitter. The combination of these features enables the use of PRs in 200-Gb/s CDRs where strict jitter requirements have resulted in LC Voltage Controlled Oscillators (LCVCOs) being the only proven option. These features also result in the lowest possible area and power for a CDR, both of which are at a premium in high-speed wireline transceivers.

The method of pipelining PRs introduced herein results in lower power and area consumption than in the traditional PR or tournament style PR. For example, a two-stage pipelined PR implemented with the method disclosed herein and with equal bits in stage one and stage two has a power and area reduction factor of (3) ($2^{-N/2}$). This power and area reduction factor is further improved if more bits are used in stage two or if additional stages are added to the PR.

The method of pipelining PRs disclosed herein is combined with the concept of twin PRs to further improve the PR non-linearity—namely the Integral Non-Linearity (INL) which directly translates to jitter during plesiochronous operation. Since power and area is at a premium in high-speed wireline transceivers, traditional twin PRs are not common in Serializer-Deserializers (SerDes). Here the use of twin PRs is enabled by the low power and area consumption of the pipelined PR.

An FIR filter is added to a CDR loop to suppress phase noise and filter jitter. This strategy has been used in fractional-N frequency synthesizers to suppress ΣΔ noise but never in a CDR to suppress noise resulting from plesiochronous operation.

200-Gb/s+ SerDes have stringent jitter requirements which have only been met with LCVCO-based CDRs. However, such implementations suffer from high power and area consumption. The method of pipelining PRs described herein combined with the utilization of twin PRs and FIR filters in the CDR show a way for PRs to be used in 200-Gb/s+ SerDes.

A CDR loop is implemented in 3 nm FinFET CMOS to test the concepts described herein. The twin pipelined PR achieves a peak-peak INL of 390-fs while consuming 10.6-mA from a 0.7V supply. During plesiochronous operation the PR phase noise was measured and integrated from DC to Nyquist resulting in an RMS jitter of 255-fs. The addition of a 27-tap Kaiser-Bessel FIR filter at the PR output further reduces the PR RMS jitter to 207-fs. Once shaped by a complete CDR loop, the jitter specifications of this PR will enable a low power and area CDR, and in turn a 200-Gb/s+ wireline transceiver that meets the <75 fs RMS random jitter standard.

The PR concepts described herein are not limited to usage within a CDR loop. In other places where PRs are present the same concepts can be used to achieve low jitter, power, and area. For example, these PR concepts can be used in inner clock generation for an Analog-to-Digital Converter (DAC) or Digital-to-Analog Converter (ADC).

To limit the total power consumed in data centers, key hardware, namely ADCs, DACs and SerDes, must only increase their power at the same rate as their speed. For example, 224 Gigabit Per Second (Gb/s) Very Short Reach (VSR) SerDes are expected to consume 448-mW total which corresponds to a power efficiency of 2 Picojoules Per Bit (pJ/b).

A SerDes (FIG. 1) consists of two main blocks: a Transmitter (Tx) and a Receiver (Rx). The Tx's main responsibility is to serialize many low-speed data paths into one high-speed data path. Conversely, the Rx deserializes the high-speed data path into many low-speed data paths. As transmission speeds increase, SerDes become increasingly reliant on high-speed medium-resolution DACs and ADCs to perform their serialization and deserialization.

Figure 2:
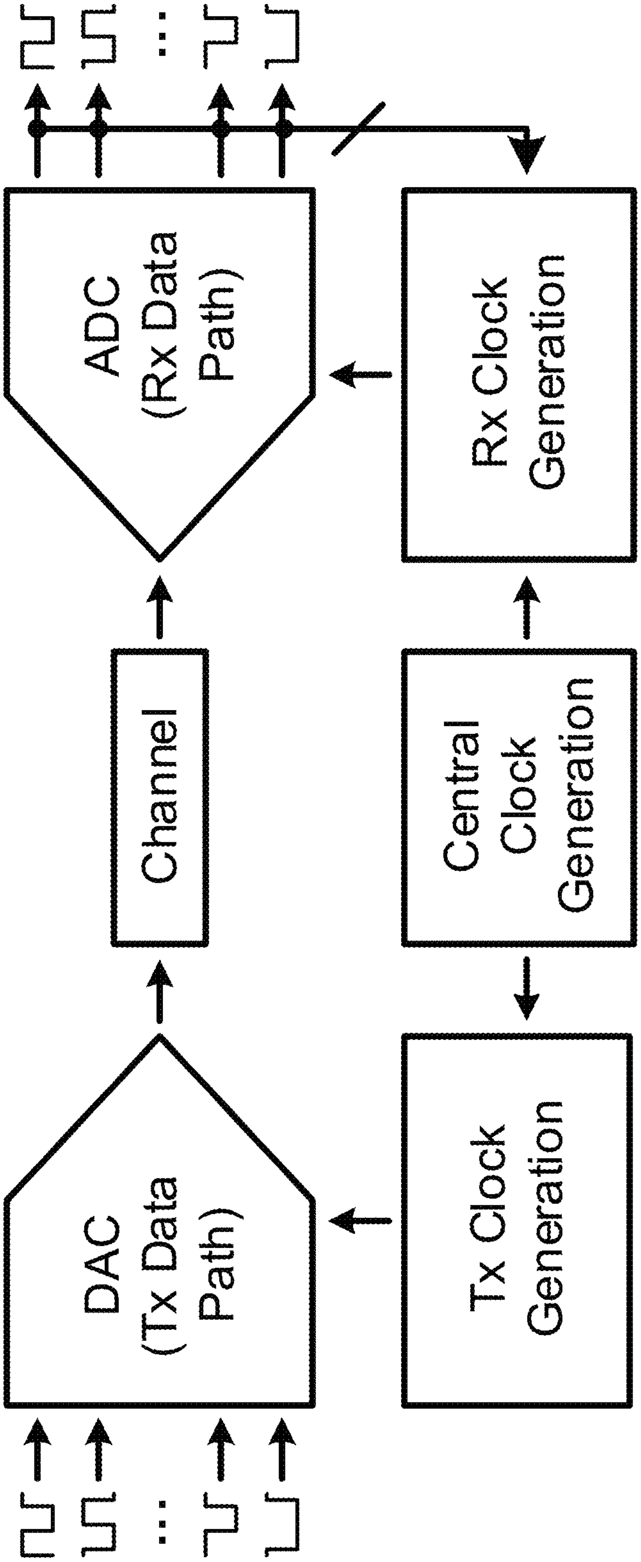
FIG. 2 shows an example, non-limiting embodiment of a SerDes using Digital-to-Analog Converters (DACs) and Analog-to-Digital Converters (ADCs) in accordance with various aspects described herein.

High-speed DACs and ADCs (FIG. 2) can be further split into two parts: the data path and the clock path. The subject disclosure addresses the clock path which consumes a large portion of the DAC and ADC power budget.

The basic purpose of a DAC is to receive an N-bit binary bus and convert it to a single analog signal. Modern DACs also perform serialization via cascaded multiplexers (MUXs) which use progressively higher-speed clocks as their select bit to combine several low-speed data paths.

The basic purpose of an ADC is to receive a single analog signal and convert it to an N-bit binary bus. Modern ADCs use time-interleaved structures where a Sampling Front-End (SFE) first deserializes the data into lower-speed paths before parallel sub-ADCs, each operating at $$\frac{F_s}{Rank1 \times Rank2},$$

perform ine actual data conversion. Fs is the overall sampling rate of the ADC. Rank 1 and Rank 2 are integers that represent the number of low-speed data paths after the first and second stages of interleaving respectively.

Figure 3:
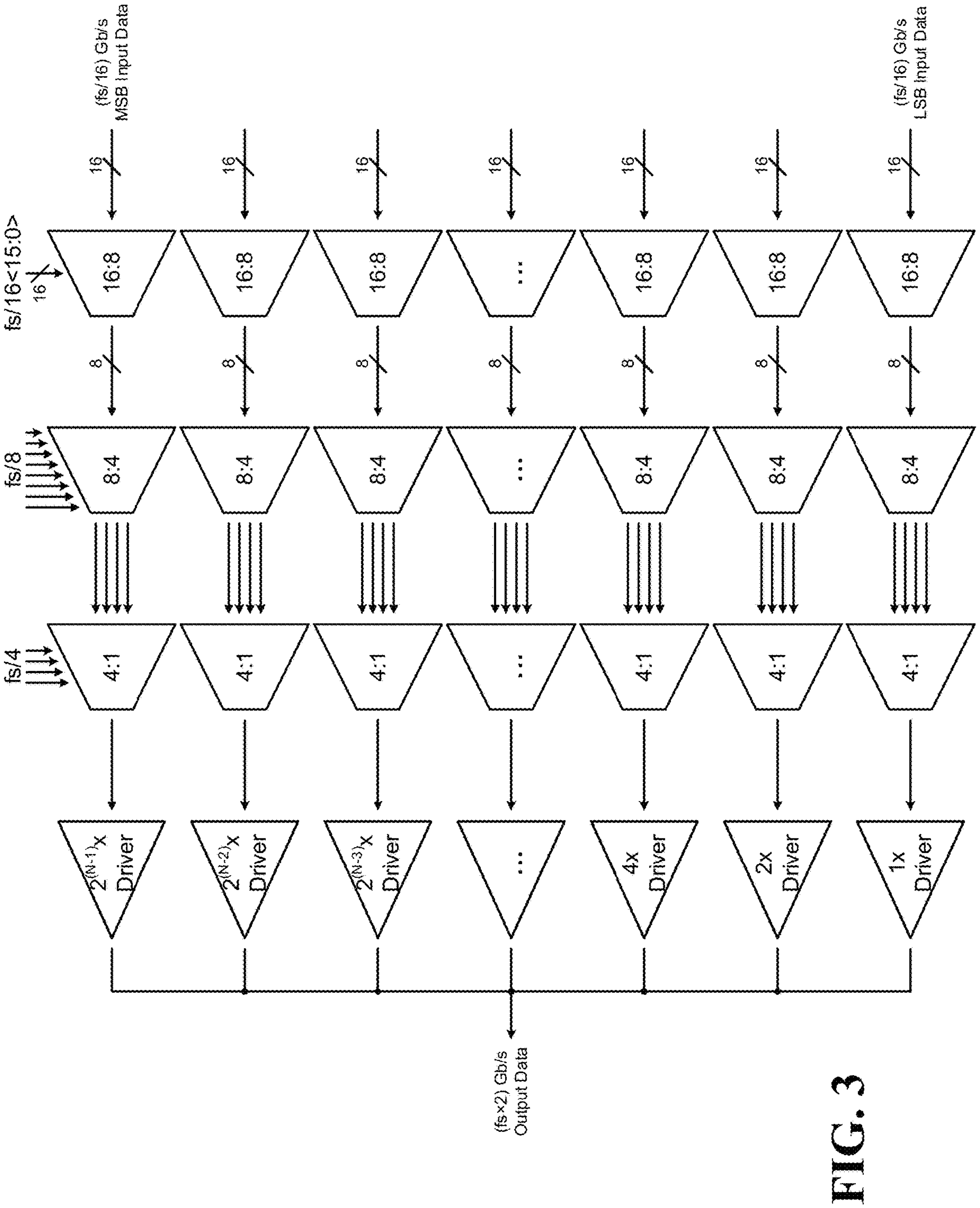
FIG. 3 shows an example, non-limiting embodiment of a standard high-speed DAC and serializer in accordance with various aspects described herein.
Figure 4:
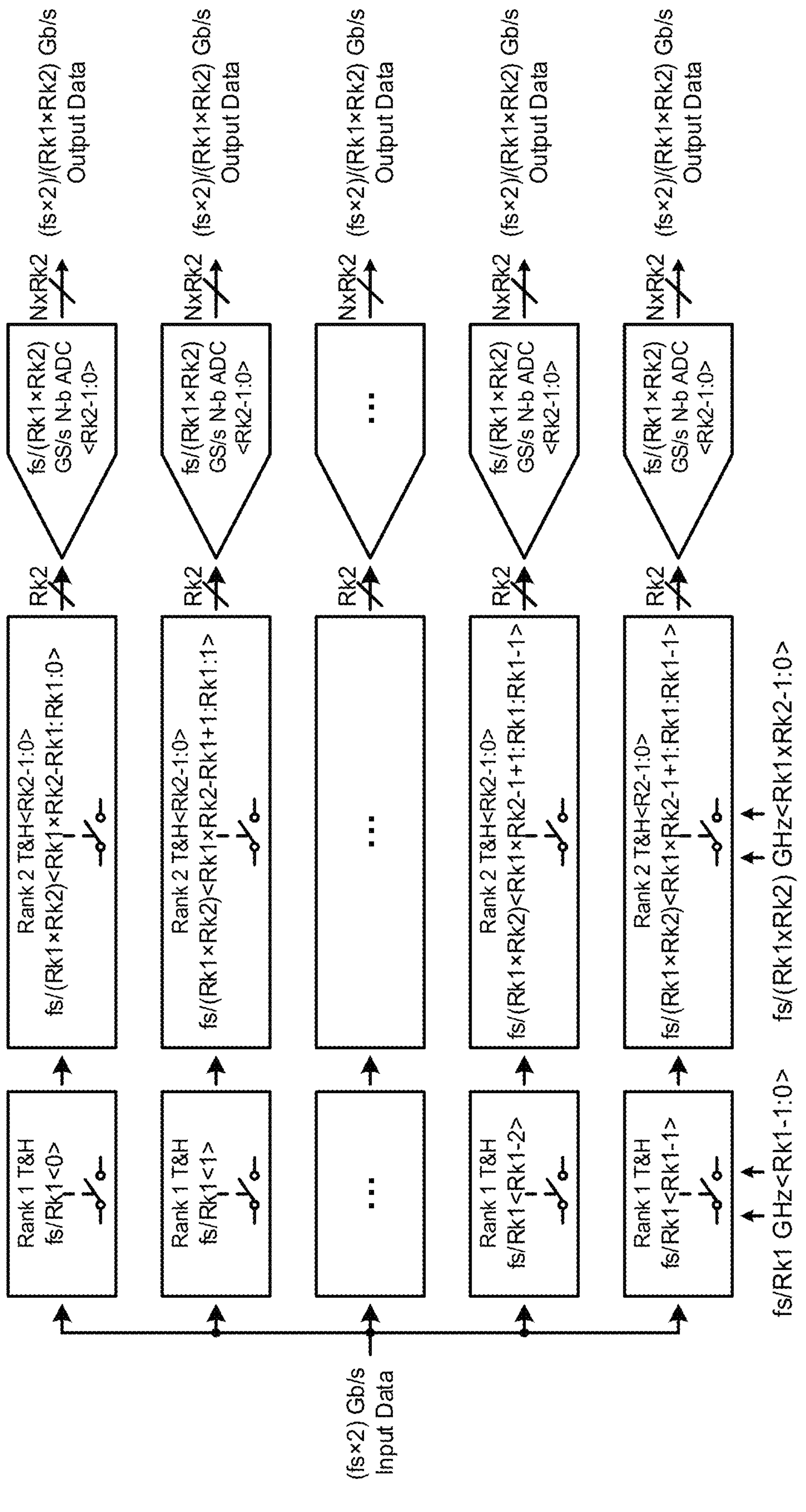
FIG. 4 shows an example, non-limiting embodiment of a standard high-speed ADC and deserializer in accordance with various aspects described herein.

Modern DACs and ADCs, see FIG. 3 and FIG. 4, have sampling rates in the range of 100-to-200 Gigasamples Per Second (GS/s) and could require multi-phase clocks operating anywhere from $$\frac{F_s}{Rank1 \times Rank2} \text{ to } \frac{F_s}{2}.$$

As an example, a 112-GS/s DAC and ADC are required to perform PAM4 encoded data transmission at 224-Gb/s. A common approach for the DAC is to utilize 16:8, 8:4 and 4:1 MUX stages. This requires four-phase clocks at $$\frac{F_s}{4} = 28 \text{ GHz},$$

eight-phase clocks at $$\frac{F_s}{8} = 14 \text{ GHz}$$

and 16-phase clocks at $$\frac{F_s}{16} = 7 \text{ GHz}.$$

For the ADC it is common for Rank 1=8 and Rank 2=12, requiring eight-phase clocks at $$\frac{F_s}{8} = 14 \text{ GHz}$$

and 96-phase clocks at $$\frac{F_s}{8 \times 12} = 1.167 \text{ GHz}.$$

Figure 5:
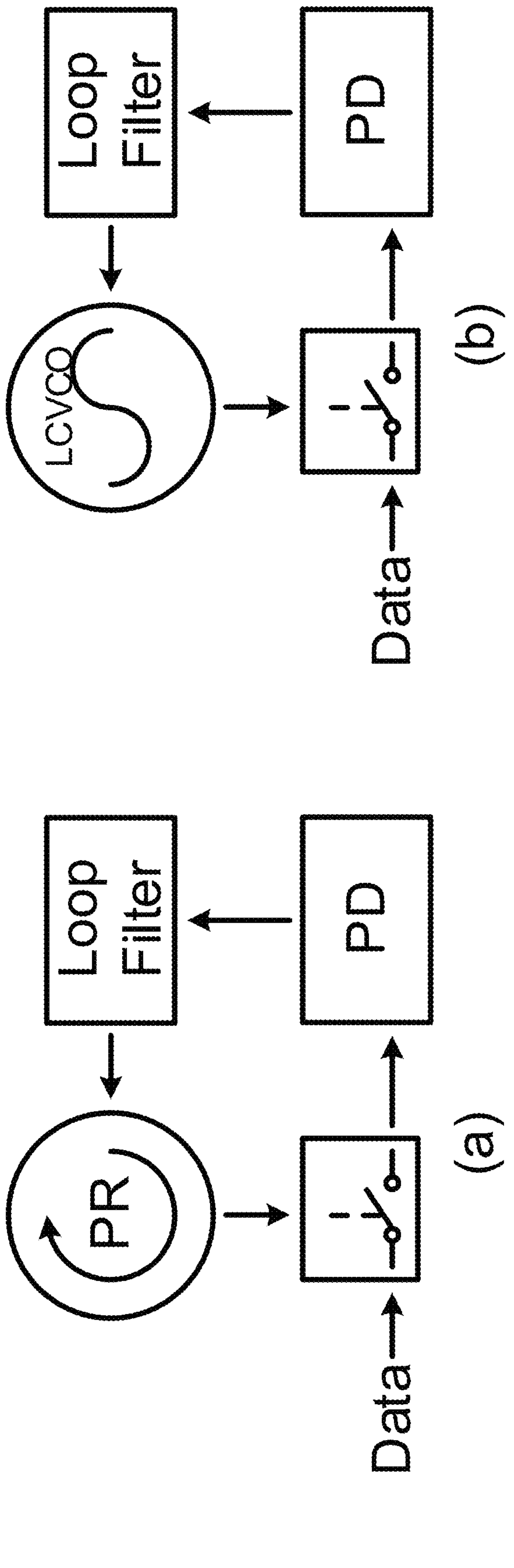
FIG. 5 shows an example, non-limiting embodiment of a clock and data recovery loop. (*a*) Phase Rotator-based Clock-and-Data Recovery (PR-based CDR). (*b*) LC Voltage Controlled Oscillator-based Clock-and-Data Recovery (LCVCO-based CDR) in accordance with various aspects described herein.

Another important aspect of SerDes is the clock-to-data alignment to ensure sampling is occurring at the optimal point. A CDR loop (FIG. 5) is used to perform this alignment. The basic operation of a CDR is as follows. Data is recovered and compared to its sampling clock using a Phase Detector (PD). The PD outputs pulses equivalent to the phase mismatch between the data and sampling clock. These pulses are then filtered and used to drive either a PR or an LCVCO.

Of these two strategies, LCVCO-based CDRs are less common because of their high power and area consumption. However, CDRs have begun using LCVCOs to meet the stringent jitter requirements. For example, 200-Gb/s SerDes implementations are expected to target <75 fs, rms random jitter. This shift is largely due to the difficulty in designing a PR that can meet this jitter requirement. However, the subject disclosure presents new concepts that make the implementation of PR-based CDRs possible at 200-Gb/s and beyond.

Figure 6:
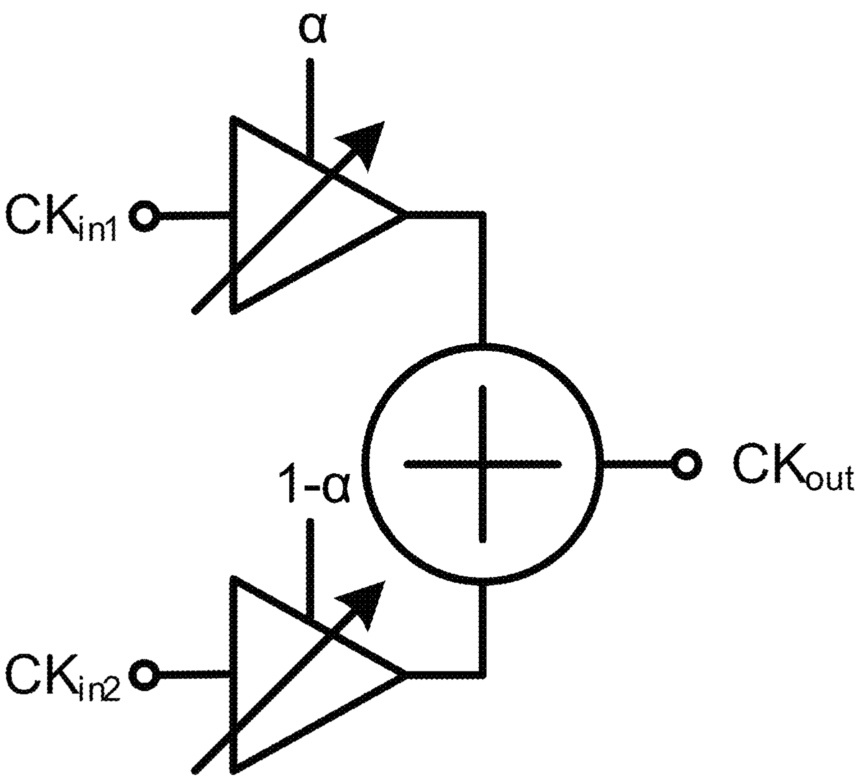
FIG. 6 shows an example, non-limiting embodiment of phase interpolation using a phase rotator in accordance with various aspects described herein.

At its simplest, a PR (FIG. 6) takes a weighted sum of two input clocks, $CK_{in1}$ and $CK_{in2}$ with phases $\theta_1$ and $\theta_2$ respectively, to generate the output $CK_{out}$ with phase $\theta_{out}$. Considering the clocks as phasors, the output is related to the input by $CK_{out}=(1-\alpha)(\cos\theta_1+j\sin\theta_1)+\alpha(\cos\theta_2+j\sin\theta_2)$. The weights of the two clocks are arranged such that $\alpha$ is between 0 and 1, so when the weight of $CK_{in1}$ is increased, the weight of $CK_{in2}$ is decreased by the same amount. This results in $\theta_{out}$ being closer to $\theta_1$ when $\alpha$ is low, and closer to $\theta_2$ when $\alpha$ is high.

When $CK_{in1}$ and $CK_{in2}$ are separated by 90°, the output clock simplifies to $CK_{out}=(1-\alpha)+j\alpha$ with output phase $$\theta_{out} = \arctan\left(\frac{\alpha}{1-\alpha}\right).$$

One defining characteristic of PRs is their INL, which is a measure of the output phase deviation from the ideal output phase. The ideal output phase of a quadrature PR is given as $\theta_{out,ideal}=(\alpha)(90°)$ thus INL can be defined as:

$$INL(°) = (\alpha)(90°) - \arctan\left(\frac{\alpha}{1-\alpha}\right).$$

INL is perhaps more useful when defined in seconds. Given an input clock period of $T_{CK}$ and N bits dedicated to phase selection, $$INL(s) = \left(\frac{(\alpha)(90°) - \arctan\left(\frac{\alpha}{1-\alpha}\right)}{\frac{90°}{2^N}}\right)\left(\frac{\frac{T_{CK}}{4}}{2^N}\right)$$

where $\alpha$ can be increased from 0 to 1 in steps of $90°/2^N$. From this formula, it is clear that to improve INL the number of bits dedicated to phase selection must be increased or the input clock period be decreased. For each additional bit added the phase rotator power consumption doubles. The phase rotator power consumption also increases linearly with the input clock frequency. Furthermore, there are diminishing returns when increasing the PR bits. Beyond 8 or 9 bits for phase selection the PR peak-to-peak INL stops improving in realistic implementations.

Another method of improving PR linearity is to have $CK_{in1}$ and $CK_{in2}$ separated by 45°. In this scenario, the output clock simplifies to $CK_{out}=(1-\alpha)+\sqrt{½}\alpha+j\sqrt{½}\alpha$ with output phase $$\theta_{out} = \arctan\left(\frac{\sqrt{1/2}\,\alpha}{1-\alpha+\sqrt{1/2}\,\alpha}\right).$$

Now INL becomes $$INL(°) = (\alpha)(45°) - \arctan\left(\frac{\sqrt{1/2}\,\alpha}{1-\alpha+\sqrt{1/2}\,\alpha}\right) \text{ and } INL(s) = \left(\frac{(\alpha)(45°) - \arctan\left(\frac{\sqrt{1/2}\,\alpha}{1-\alpha+\sqrt{1/2}\,\alpha}\right)}{\frac{45°}{N}}\right)\left(\frac{\frac{T_{CK}}{8}}{2^N}\right).$$

While the INL is improved, an octagonal PR implementation requires 8 input phases which adds significant complexity and power earlier in the CDR.

Figure 7:
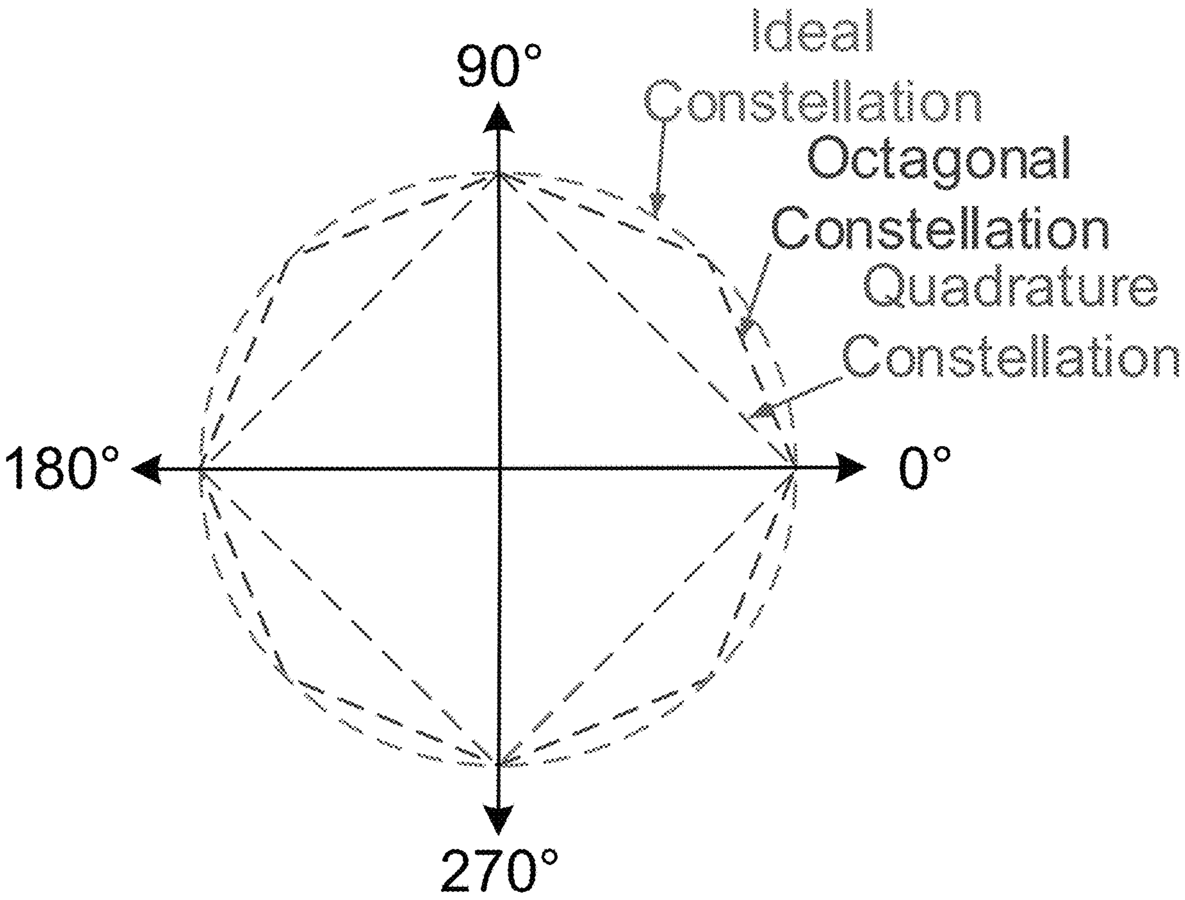
FIG. 7 shows an example, non-limiting embodiment of a constellation diagram for an octagonal and quadrature phase rotator in accordance with various aspects described herein.
Figure 8:
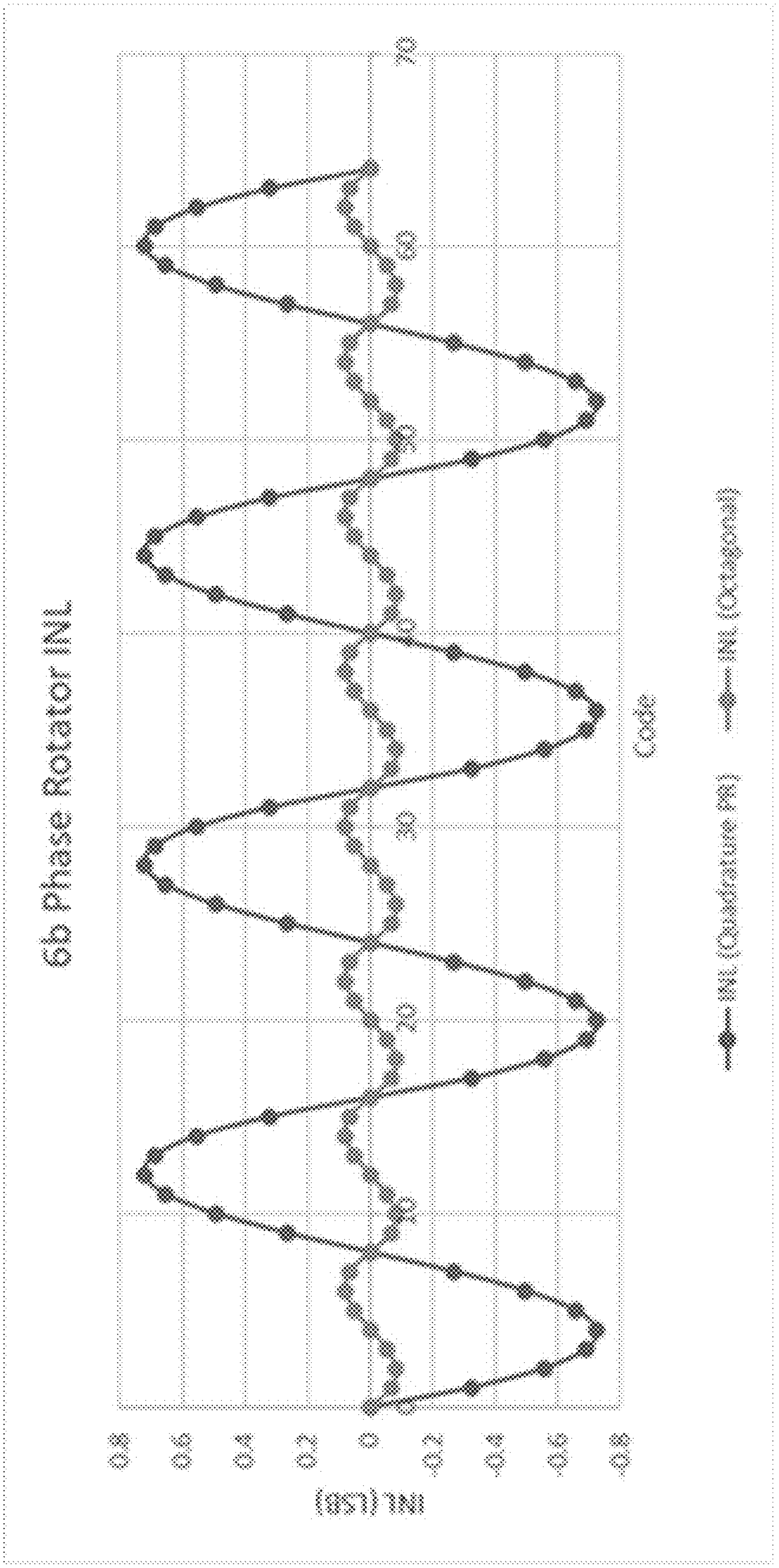
FIG. 8 shows an example, non-limiting embodiment of an Integral Non-Linearity for a 6b quadrature and octagonal phase rotator in accordance with various aspects described herein.
Figure 9:
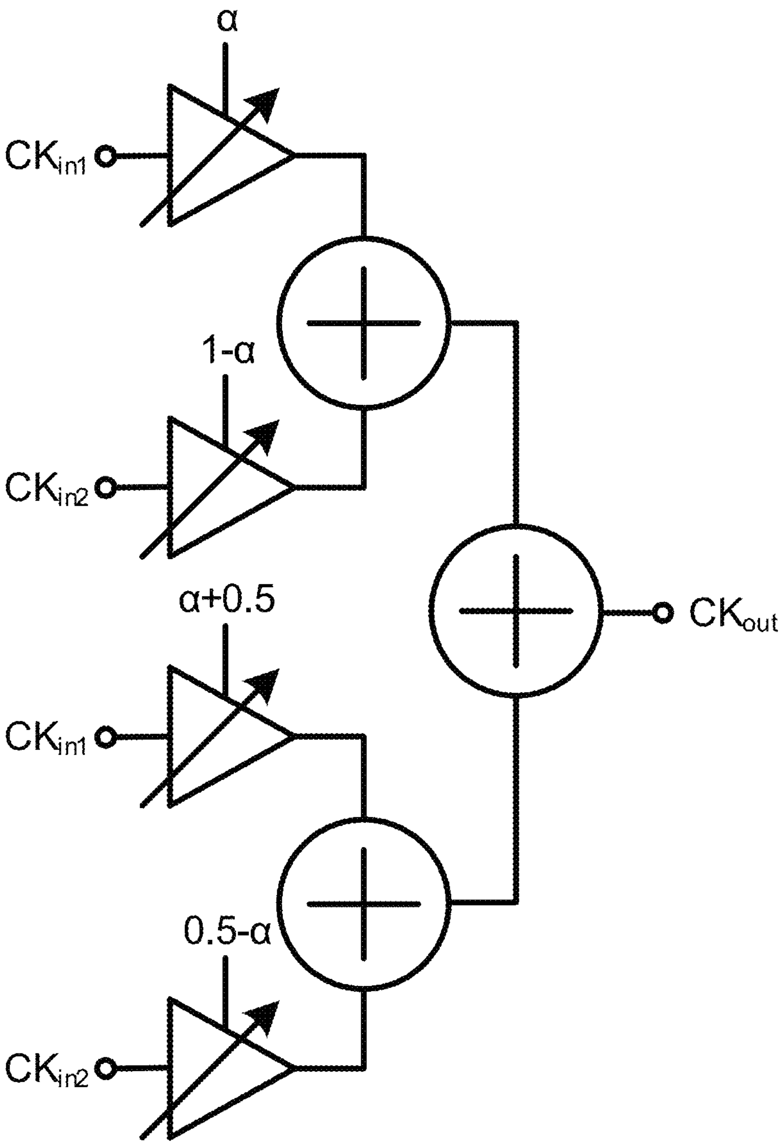
FIG. 9 shows an example, non-limiting embodiment of a twin phase rotator in accordance with various aspects described herein.
Figure 10:
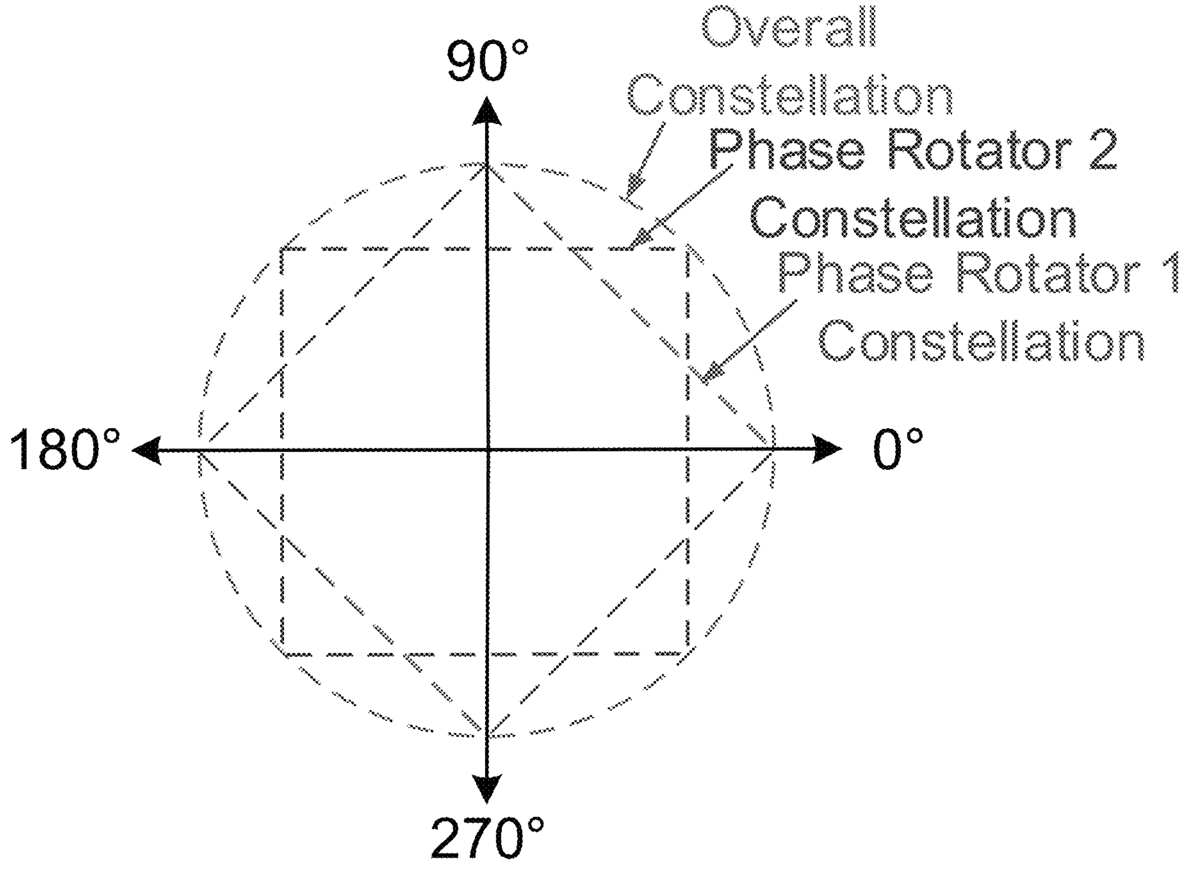
FIG. 10 shows an example, non-limiting embodiment of a twin phase rotator constellation diagram in accordance with various aspects described herein.

A comparison of phase rotator constellations for an ideal, octagonal and quadrature implementation can be seen in FIG. 7. FIG. 8 compares the theoretical INL for a 6b octagonal and quadrature PR. The worst-case jitter for a CDR occurs during plesiochronous operation, where there exists a frequency mismatch between the incoming data and the sampling clock. This causes the PR to spin and not lock to a single phase. The peak-peak INL measured in seconds translates to random jitter during plesiochronous operation. Thus, for PRs to be used in CDRs for 200-Gb/s links it is critical that new low power methods of improving INL are found. The INL formula gives a local maximum when $\alpha=0.25$ and a local minimum when a =0.75. One strategy that has been shown to improve PR linearity is the use of twin PRs (FIG. 9). The concept is to sum the output of two PRs with $\alpha_{PR2}=\alpha_{PR1}+0.5$. The INL of $PR_1$ is at a minimum when the INL of $PR_2$ is at a maximum and vice versa, thus resulting in the INL approximately canceling out. The twin PR constellation diagram can be seen in FIG. 10.

Figure 11:
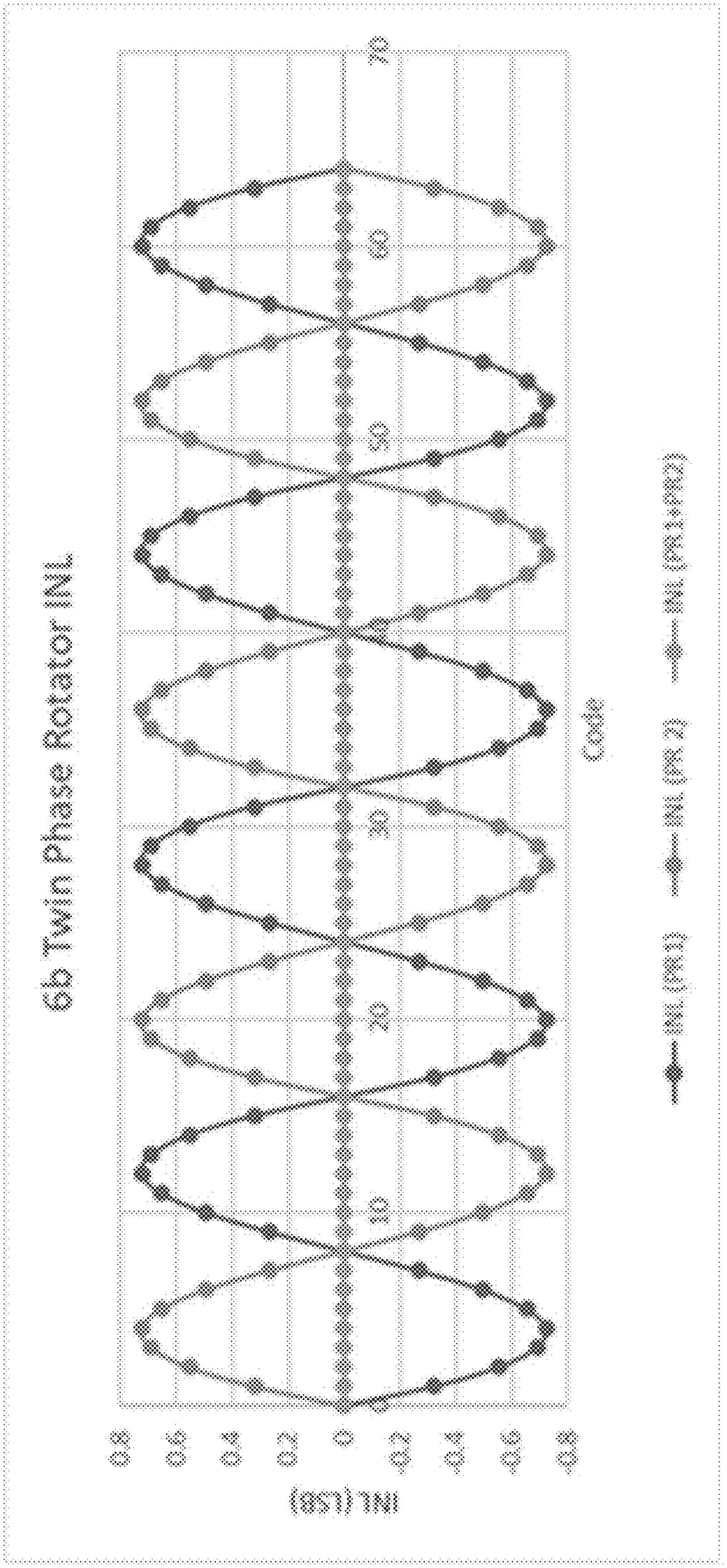
FIG. 11 shows an example, non-limiting embodiment of an Integral Non-Linearity for a twin phase rotator in accordance with various aspects described herein.

FIG. 11 compares the theoretical INL for a traditional 6b quadrature PR to that of a twin 6b quadrature PR.

Process, Voltage and Temperature (PVT) variations cause the INL of each PR to lose some correlation, so the result is not zero non-linearity, but the INL is significantly lowered. The drawback of this concept is the PR power and area consumption is doubled.

Figure 12:
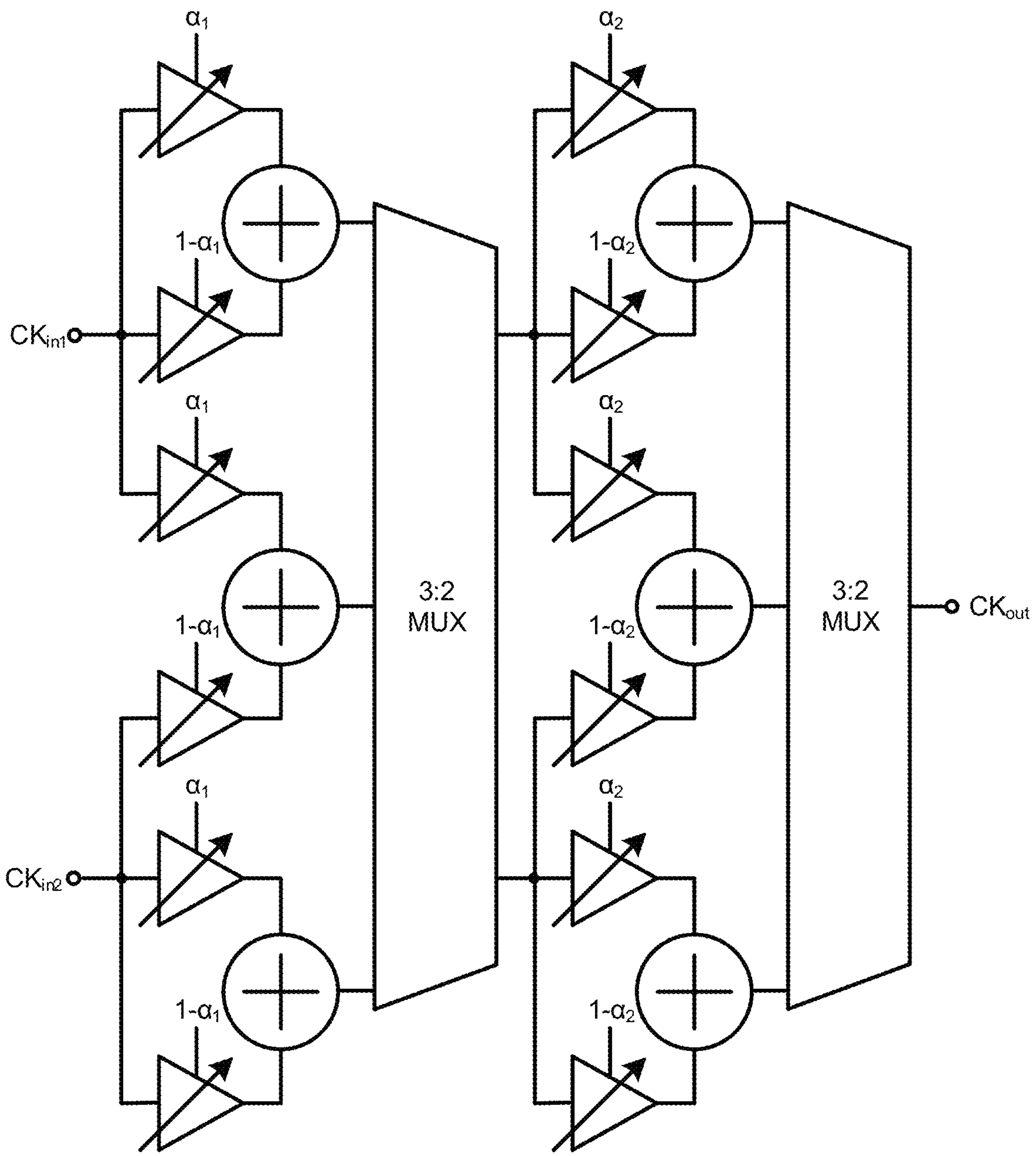
FIG. 12 shows an example, non-limiting embodiment of a two stage tournament style pipelined phase rotator in accordance with various aspects described herein.

The subject disclosure presents a PR concept that can be used to lower power and area consumption using pipelining. The concept behind PR pipelining is to split the bits dedicated to phase selection across multiple stages. Previously utilized PR pipelining was done in a tournament style where extra PRs are used in each stage and MUXing is used after each stage to decide what phase to forward (FIG. 12). While each driver stage in a tournament style PR uses less power, there is an increase in the total number of driver stages resulting in no power or area savings. This style of PR is more akin to multi-phase generation, thus achieving improved linearity (like going from a quadrature PR to an octagonal PR) but the power consumption is equal to or greater than that of the traditional PR.

Figure 13:
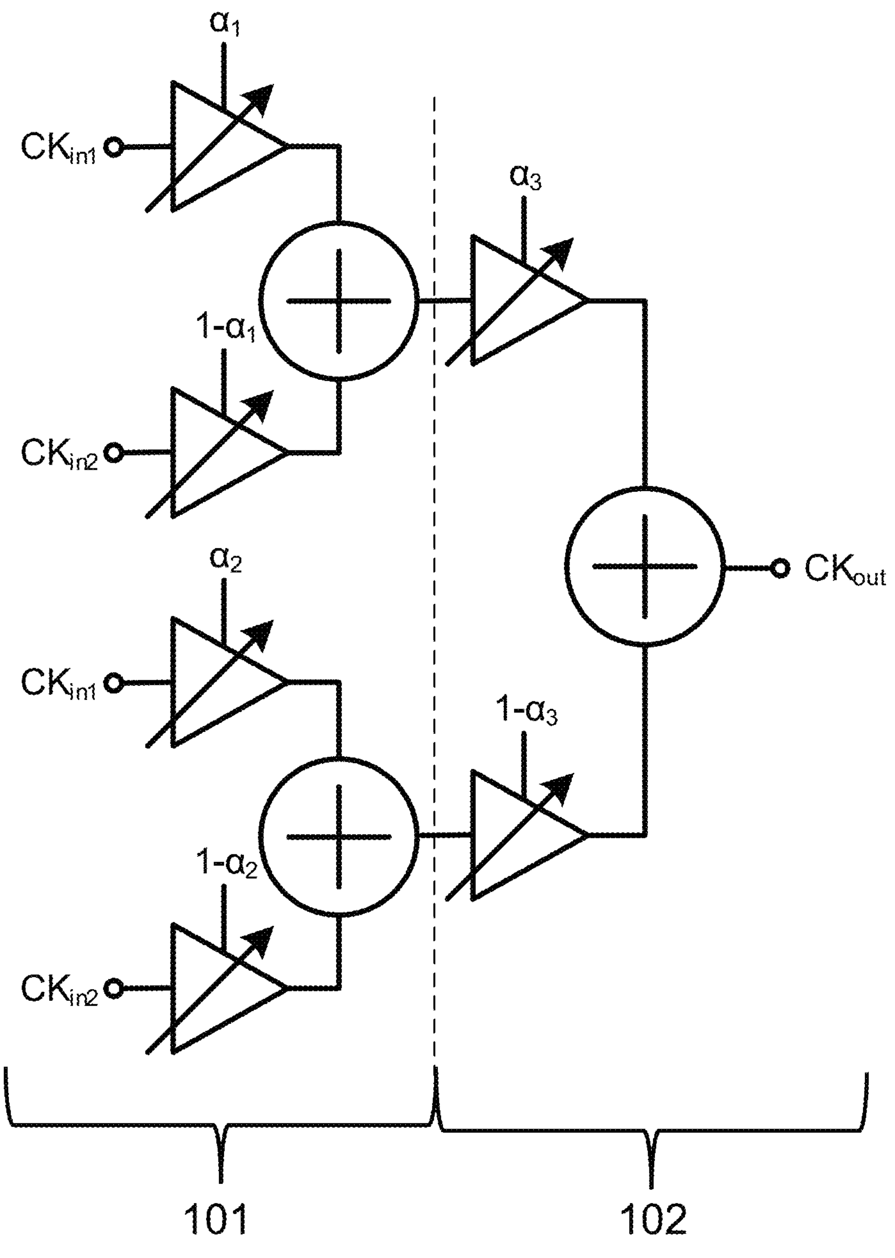
FIG. 13 shows an example, non-limiting embodiment of a two-stage pipelined phase rotator in accordance with various aspects described herein.

The method of PR pipelining disclosed herein uses the same number of PRs in stage one as the total number of stages, but in each subsequent stage the total number of PRs decreases. Consider, for example, a two-stage PR separated by a dashed line utilizing the method of pipelining disclosed herein (FIG. 13). Stage one, depicted by reference number 101, utilizes two parallel PRs to generate two clock phases offset by a single Least Significant Bit (LSB). Stage two, depicted by reference number 102, then uses a single PR to interpolate between these two phases entering the second stage.

For a comparison, consider a traditional PR where N bits are dedicated to phase selection. Each controllable driver stage requires $2^N$ unit devices so in total $(2)(2^N)$ total unit devices are used in the PR. In the method of pipelining disclosed herein, $$\frac{N}{2} \text{ bits}$$

are used in stage one and $$\frac{N}{2} \text{ bits}$$

are used in stage two. The same resolution is achieved but $(4)(2^{N/2})$ unit devices are needed in stage one and $(2)(2^{N/2})$ devices are needed in stage two. Thus, the total number of unit devices is now $(6)(2^{N/2})$ resulting in a significant power and area reduction factor of $(3)(2^{-N/2})$. This power and area reduction factor can be further improved if more bits are used in stage two than in stage one. For example, in one non-limiting embodiment, four bits may be used in the first stage and five bits in the second stage. As more stages are added to the method of PR pipelining disclosed herein, the total number of unit devices continues to decrease, and the power and area reduction factor is further improved.

Figure 14:
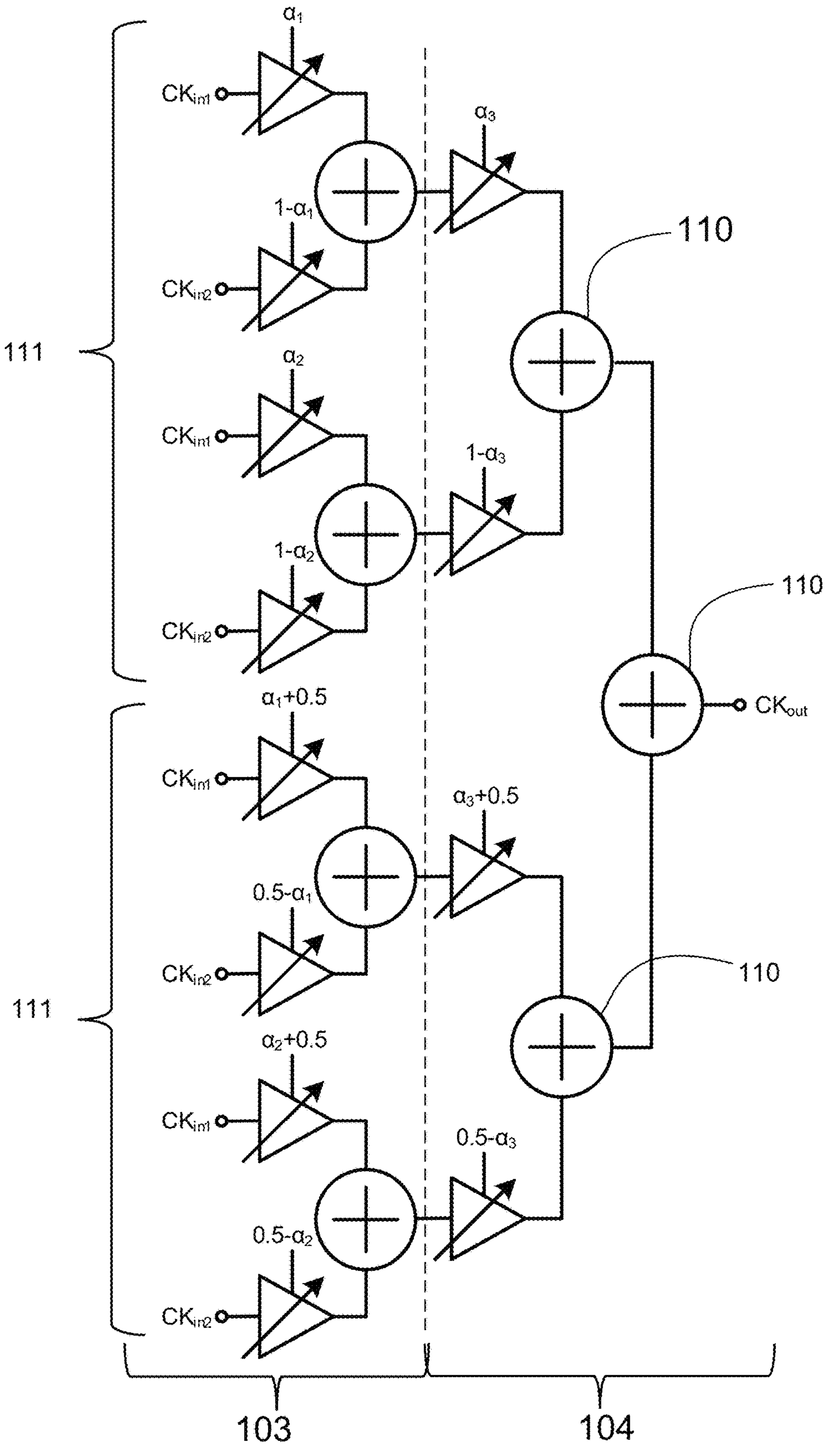
FIG. 14 shows an example, non-limiting embodiment of a two-stage pipelined twin phase rotator in accordance with various aspects described herein.

An example of a two stage pipelined twin phase rotator is shown in FIG. 14. Stage one, depicted by reference number 103, utilizes twin two parallel PRs 111. Stage two, depicted by reference number 104, uses two parallel PRs. Summation nodes are depicted by reference number 110. This enables the use of twin PRs without a significant power or area penalty. Combining these concepts results in a highly linear, low power PR that can be used in future generations of SerDes.

Figure 15:
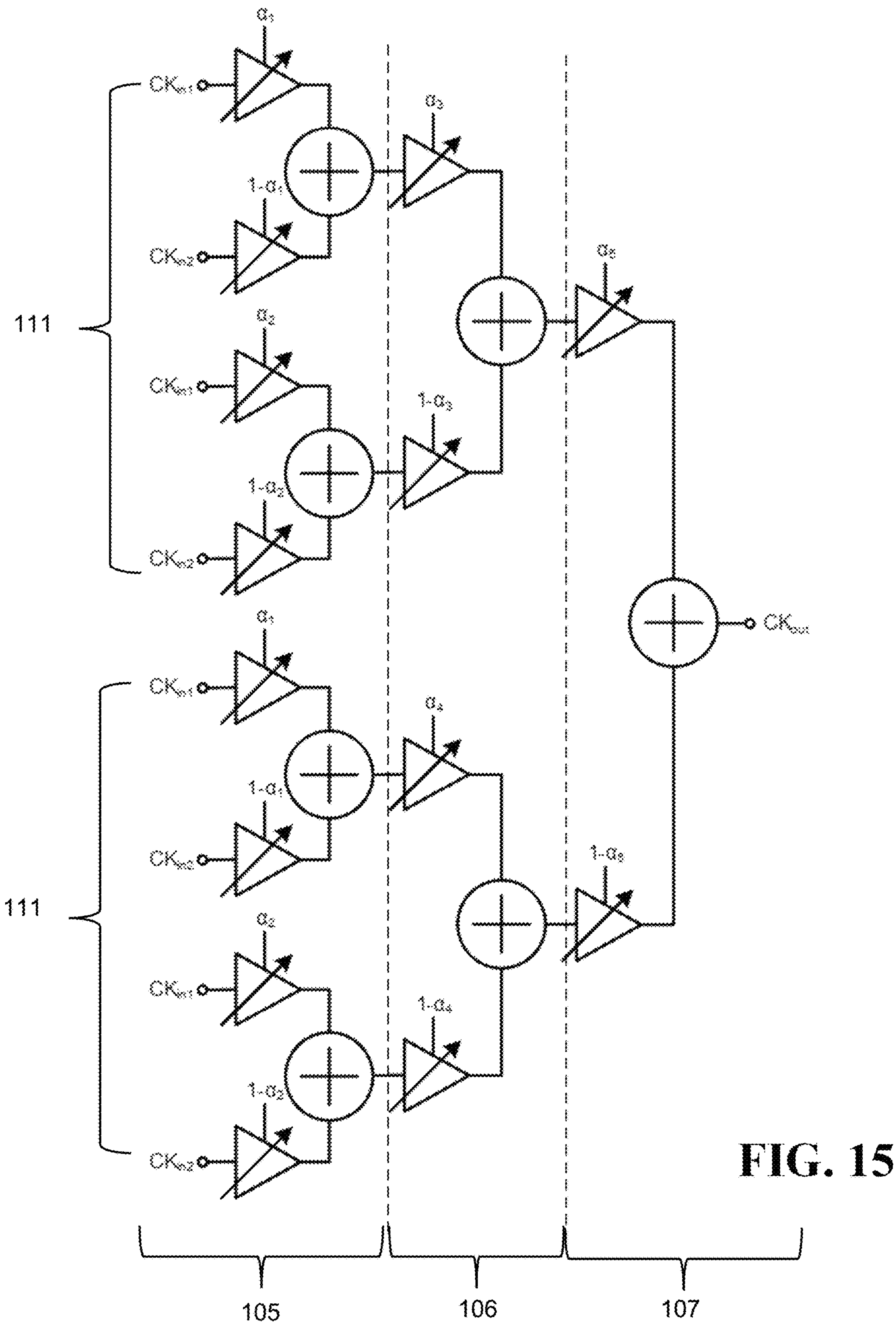
FIG. 15 shows an example, non-limiting embodiment of a three-stage pipelined phase rotator in accordance with various aspects described herein.

In another non-limiting embodiment, shown in FIG. 15, a three-stage pipelined phase rotator may be implemented. Stage one, depicted by reference number 105, utilizes twin two parallel PRs 111. Stage two, depicted by reference number 106, uses two parallel PRs. Stage three, depicted by reference number 107, uses a single PR. There may be any value of $\alpha_1$ compared to $\alpha_2$ (and $\alpha_3$ to $\alpha_4$). Optimally these codes are 1 LSB offset from each other, but this is not required. They could be any offset while still achieving many benefits. For example, say CKin1 is 0° and Ckin2 is 90° and 3 bits are dedicated to stage 1. If $\alpha_1$ and $\alpha_2$ are 1 LSB offset then stage 2 is interpolating between phases which are offset by $90° / 2^3 = 11.25°$. If $\alpha_1$ and $\alpha_2$ are offset by 2 LSBs then stage 2 interpolates between phases which are offset by 22.5°.

Figure 16:
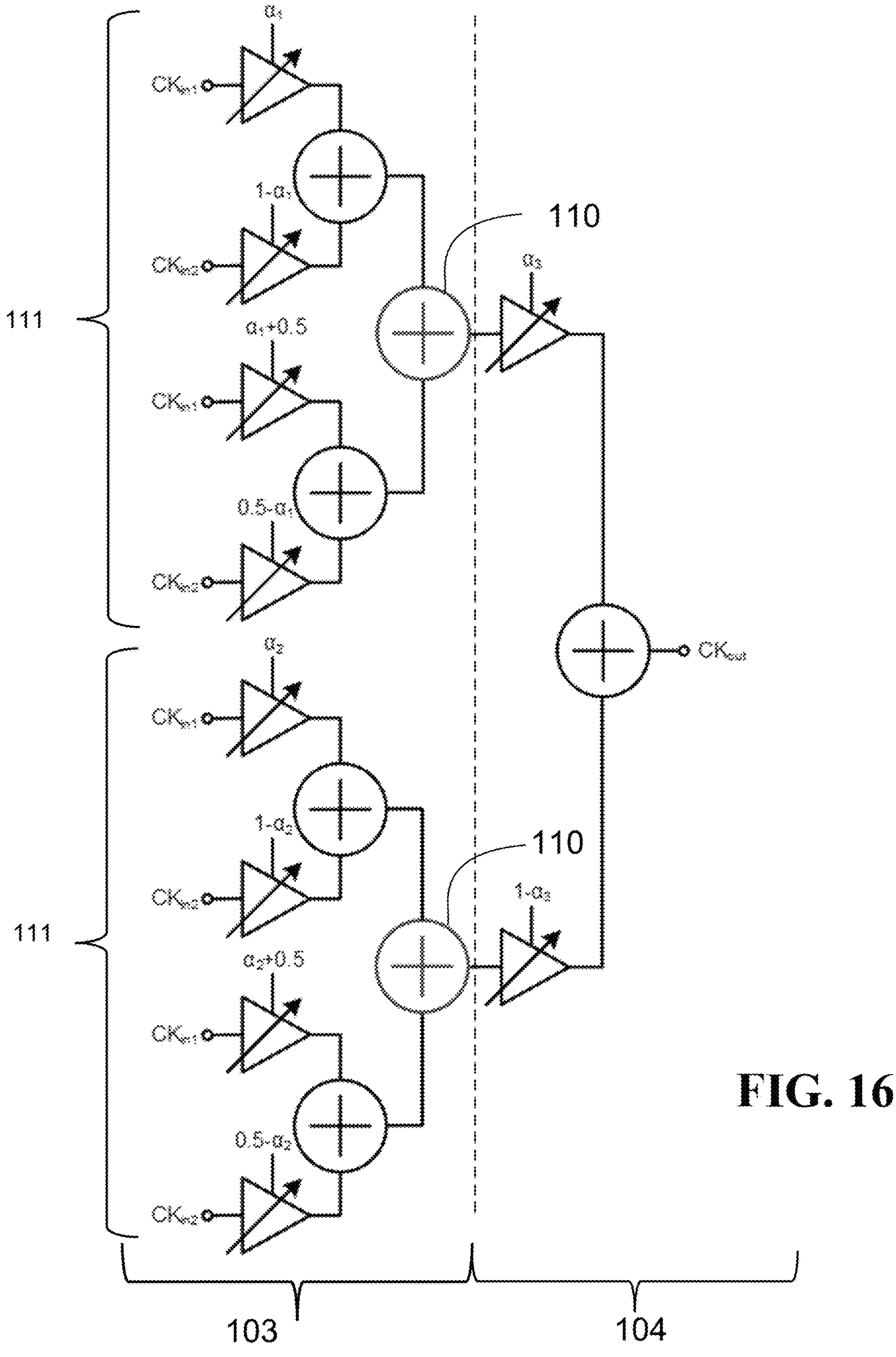
FIG. 16 shows another example, non-limiting embodiment of a two-stage pipelined twin phase rotator in accordance with various aspects described herein.

In another non-limiting embodiment, the location of the summation nodes 110 in the two stage pipelined phase rotator may change, see for example, FIG. 16, and still have some pipelining occur afterwards. Note the rearranging of the alpha values amongst the stages. The benefit of this implementation is the drop of 2 of the unit cell groups from stage 2 saving an additional $2 \times 2^N$ unit cells in the overall design, where N is the number of bits dedicated to stage 2.

Figure 17:
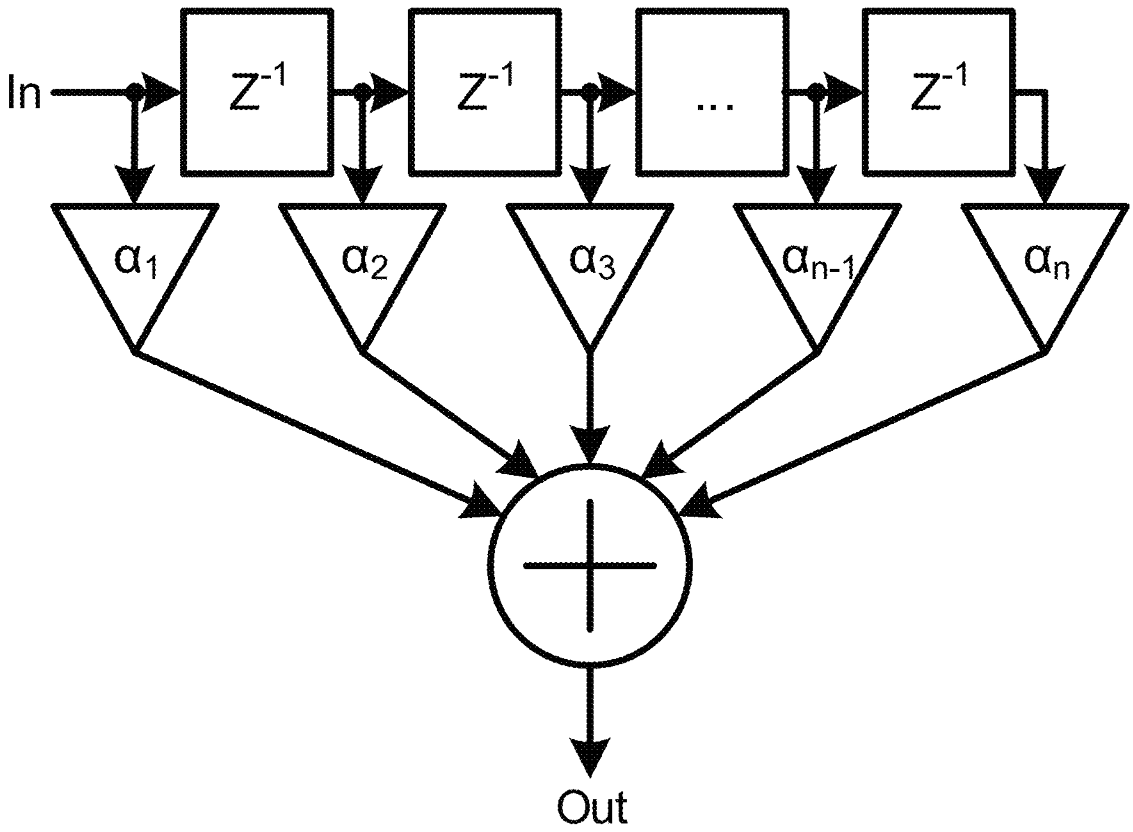
FIG. 17 shows an example, non-limiting embodiment of a finite impulse response filter in accordance with various aspects described herein.

Another embodiment of the subject disclosure includes improving PR linearity by adding an FIR filter to the output of the PR. FIR filters have been used in the feedback path of fractional-N frequency synthesizers to suppress ΣΔ noise. The subject disclosure presents utilizing FIR filters in a CDR. An FIR filter can be seen in FIG. 17. In the basic FIR filter all a coefficients are equal resulting in a stop band attenuation of $20 \log_{10} N$ at $f_{sample}/2$ and a 3-dB BW that is proportional to $f_{sample}/N$ where N is the number of FIR taps and $f_{sample} = 1/T_D$ where $T_D$ is the $z^{-1}$ delay.

Figure 18:
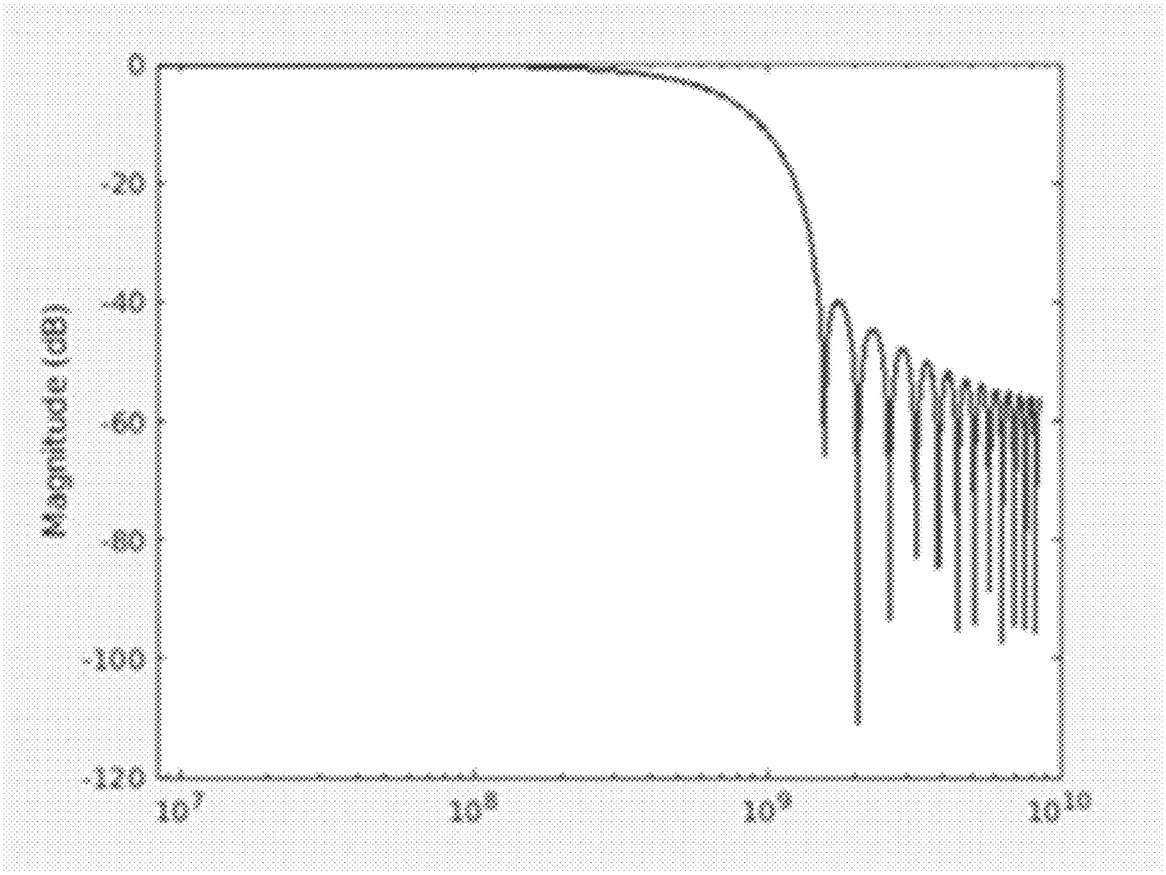
FIG. 18 shows an example, non-limiting embodiment of a 27 tap Kaiser-Bessel Finite Impulse Response (FIR) frequency response with $f_{3dB}$=1 GHz and $f_{sample}$=17 GHz in accordance with various aspects described herein.
Figure 19:
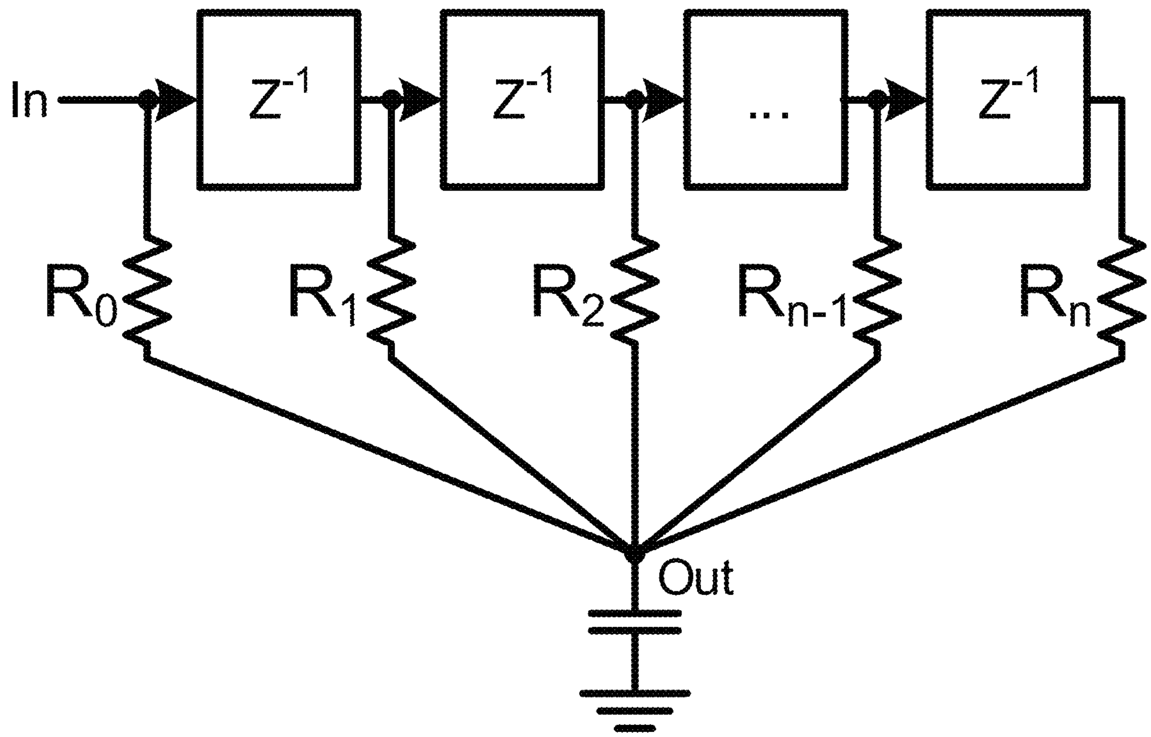
FIG. 19 shows an example, non-limiting embodiment of an analog FIR filter using voltage mode summation in accordance with various aspects described herein.

In an analog implementation, increasing FIR taps beyond tens of taps can be difficult and prone to error but this still provides sufficient stop band attenuation and bandwidth to significantly reduce the phase noise introduced by a PR. Other types of FIR filters, for example a Kaiser-Bessel FIR, can be used to improve the stop band attenuation and 3-dB bandwidth without increasing the number of taps. In such an implementation the coefficients are calculated using a zeroth order modified Bessel function of the first kind. An example of a 27 tap Kaiser-Bessel FIR frequency response 200 with $f_{sample} = 17$ GHz can be seen in FIG. 18. The stop band attenuation is around 40-dB and the 3-dB bandwidth is around 1 GHz. An example of an analog FIR filter implementation can be seen in FIG. 19. Summation is done in the voltage domain and the resistor values are modified to set the tap coefficients.

Figure 20:
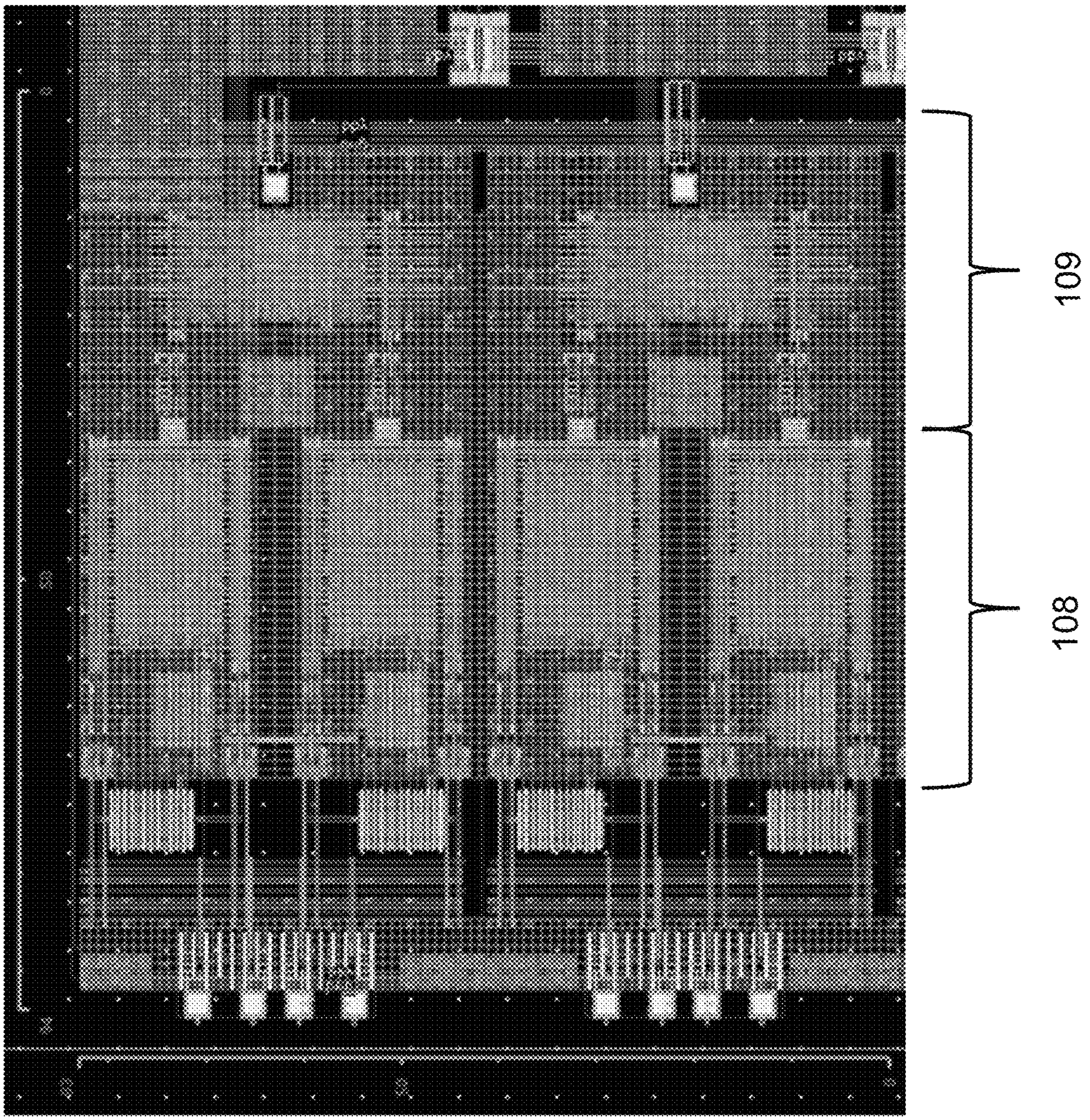
FIG. 20 shows an example, non-limiting embodiment of a layout of a two-stage pipelined twin phase rotator in accordance with various aspects described herein.

To test the concepts disclosed herein, an 11-bit, 17-GHz version of the phase rotator from FIG. 14 was implemented in 3-nm FinFET CMOS and simulated using Cadence Spectre. The layout of the phase rotator can be seen in FIG. 20. The first stage is depicted by reference number 108 and the second stage is depicted by reference number 109. The two stage pipelined twin phase rotator has an active area of 83 μm×94 μm.

Figure 21:
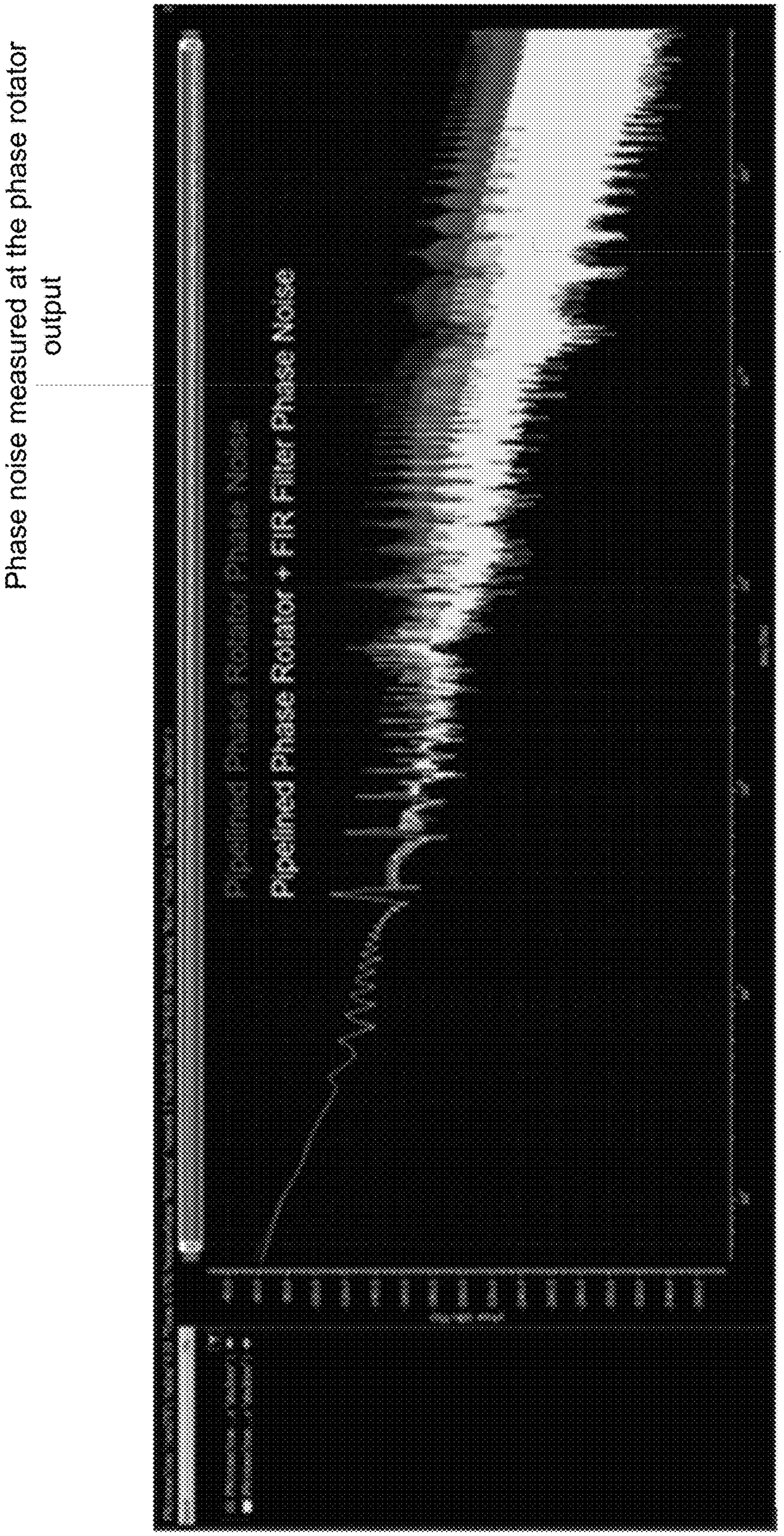
FIG. 21 shows an example, non-limiting embodiment of phase noise plots of a FIR filter connected to an output of a PR in accordance with various aspects described herein.

A simulation was run with the PR in plesiochronous operation. The resulting phase noise plot can be seen in FIG. 21. The RMS jitter was measured to be 255-fs integrating from DC-to-$f_{CK}/2$. This number is also state of the art. In another simulation with the PR in static operation the jitter was measured to be 55-fs. Another simulation was then run with an FIR filter following the PR. The resulting phase noise can also be seen in FIG. 21, and the improvement in the phase noise with the FIR filter is clear. This improvement is again shown by measuring the RMS jitter which dropped from 255-fs to 207-fs.

The use of terms “first,” “second,” “third,” and so forth, as used in the claims, unless otherwise clear by context, is for clarity only and does not otherwise indicate or imply any order.

In addition, the words “example” and “exemplary” are used herein to mean serving as an instance or illustration. Any embodiment or design described herein as “example” or “exemplary” is not necessarily to be construed as preferred or advantageous over other embodiments or designs. Rather, use of the word example or exemplary is intended to present concepts in a concrete fashion. As used in this application, the term “or” is intended to mean an inclusive “or” rather than an exclusive “or”. That is, unless specified otherwise or clear from context, “X employs A or B” is intended to mean any of the natural inclusive permutations. That is, if X employs A; X employs B; or X employs both A and B, then “X employs A or B” is satisfied under any of the foregoing instances. In addition, the articles “a” and “an” as used in this application and the appended claims should generally be construed to mean “one or more” unless specified otherwise or clear from context to be directed to a singular form.

As employed herein, the term “processor” can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details.

What is claimed is:

1. A multiple stage pipelined phase rotator, comprising:

a first stage of phase rotators comprising a first number of bits based on a total number of bits dedicated to phase selection, wherein each phase rotator in the first stage comprises a first number of phase interpolator unit cells determined according to the first number of bits; and a second stage comprising a second number of phase rotators receiving outputs from the first stage, the second stage outputting a first weighted sum of respective clock phases generated by the second number of phase rotators, wherein the second stage has a second number of bits based on the total number of bits dedicated to phase selection, and wherein each phase rotator in the second stage comprises a second number of phase interpolator unit cells determined according to the second number of bits dedicated to phase selection, wherein the total number of bits dedicated to phase selection is split across the first stage and the second stage.

2. The multiple stage pipelined phase rotator according to claim 1, wherein the first stage and the second stage further comprise a first plurality of summation nodes and a second plurality of summation nodes, respectively, receiving outputs of phase interpolator unit cells of respective phase rotators.

3. The multiple stage pipelined phase rotator according to claim 1, further comprising a third stage comprising a third number of phase rotators receiving outputs from the second number of phase rotators of the second stage, the third stage outputting a second weighted sum of respective clock phases generated by the third number of phase rotators, wherein the third number of phase rotators is less than the second number of phase rotators.

4. The multiple stage pipelined phase rotator according to claim 1, wherein the second number of bits dedicated to phase selection used in the second stage is greater than the first number of bits dedicated to phase selection used in the first stage.

5. The multiple stage pipelined phase rotator according to claim 1, wherein the first number of phase interpolator unit cells and the second number of phase interpolator unit cells comprise inverters with controllable variable drive strength or common source amplifiers.

6. The multiple stage pipelined phase rotator according to claim 2, further comprising an intermediate stage between the first stage and the second stage, the intermediate stage comprising a third plurality of summation nodes receiving outputs of the first plurality of summation nodes.

7. The multiple stage pipelined phase rotator according to claim 1, wherein the total number of bits dedicated to phase selection across the first stage and the second stage is nine.

8. A method for pipelining phase rotators, comprising:

implementing a first stage of phase rotators comprising a first number of bits based on a total number of bits dedicated to phase selection, and wherein each phase rotator in the first stage comprises a first number of phase interpolator unit cells determined according to the first number of bits; and implementing a second stage comprising a second number of phase rotators receiving outputs from the first stage, the second stage outputting a first weighted sum of respective clock phases generated by the second number of phase rotators, wherein the second stage has a second number of bits based on the total number of bits dedicated to phase selection, and wherein each phase rotator in the second stage comprises a second number of phase interpolator unit cells determined according to the second number of bits dedicated to phase selection, wherein the total number of bits dedicated to phase selection is split across the first stage and the second stage.

9. The method for pipelining phase rotators according to claim 8, wherein the first stage and the second stage further comprise a first plurality of summation nodes and a second plurality of summation nodes, respectively, receiving outputs of phase interpolator unit cells of respective phase rotators.

10. The method for pipelining phase rotators according to claim 9, further comprising implementing a third stage comprising a third number of phase rotators receiving outputs from the second number of phase rotators of the second stage, the third stage outputting a second weighted sum of respective clock phases generated by the third number of phase rotators, wherein the third number of phase rotators is less than the second number of phase rotators.

11. The method for pipelining phase rotators according to claim 8, wherein the second number of bits dedicated to phase selection used in the second stage is greater than the first number of bits dedicated to phase selection used in the first stage.

12. The method for pipelining phase rotators according to claim 8, wherein the first number of phase interpolator unit cells and the second number of phase interpolator unit cells comprise inverters with controllable variable drive strength or common source amplifiers.

13. The method for pipelining phase rotators according to claim 10, further comprising implementing an intermediate stage between the first stage and the second stage, the intermediate stage comprising a third plurality of summation nodes receiving outputs of the first plurality of summation nodes.

14. The method for pipelining phase rotators according to claim 8, wherein the total number of bits dedicated to phase selection across the first stage and the second stage is nine.

15. A Clock-and-Data Recovery (CDR) loop, comprising:

a data sampler that samples incoming data; and a phase rotator that receives a code from a loop filter and instructs the data sampler to sample the incoming data, wherein a Finite Impulse Response (FIR) filter is interposed between an output of the phase rotator and a clock input of the data sampler to reduce phase noise introduced by integral non-linearity of the phase rotator during plesiochronous operation in which the incoming data has a frequency offset relative to a sampling clock of the data sampler.

16. The CDR loop according to claim 15, wherein the FIR filter comprises a Kaiser-Bessel FIR.

17. The CDR loop according to claim 15, wherein the phase rotator comprises:

a first stage comprising a first number of phase rotators in parallel generating respective clock phases offset by a fixed amount; and a second stage comprising a second number of phase rotators receiving outputs from the first number of phase rotators of the first stage, the second stage outputting a first weighted sum of respective clock phases generated by the second number of phase rotators, wherein the second number of phase rotators is less than the first number of phase rotators, and wherein a total number of bits dedicated to phase selection is split across the first stage and the second stage.

18. The CDR loop according to claim 15, wherein the data sampler is part of an Analog-to-Digital Converter (ADC) and is implemented along with the phase rotator in an analog macro and the loop filter are implemented in a Digital Signal Processing (DSP) engine.

19. The CDR loop according to claim 15, wherein the FIR filter comprises an analog FIR using voltage mode summation.

20. The CDR loop according to claim 17, wherein a total number of unit devices is equal to six times two raised to a power of half of the total number of bits.

* * * * *